(12) United States Patent
Kim et al.

(10) Patent No.: US 10,957,670 B2
(45) Date of Patent: Mar. 23, 2021

(54) PACKAGE-ON-PACKAGE AND PACKAGE CONNECTION SYSTEM COMPRISING THE SAME

(71) Applicant: SAMSUNG ELECTRO-MECHANICS CO., LTD., Suwon-si (KR)

(72) Inventors: Hyung Joon Kim, Suwon-si (KR); Seok Hwan Kim, Suwon-si (KR); Sung Il Jo, Suwon-si (KR); Jung Ho Shim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/540,715

(22) Filed: Aug. 14, 2019

(65) Prior Publication Data

US 2020/0373271 A1 Nov. 26, 2020

(30) Foreign Application Priority Data

May 21, 2019 (KR) .......................... 10-2019-0059710

(51) Int. Cl.
| | |
|---|---|
| *H01L 23/31* | (2006.01) |
| *H01L 23/00* | (2006.01) |
| *H01L 23/495* | (2006.01) |
| *H01L 23/498* | (2006.01) |
| *H01L 23/48* | (2006.01) |

(52) U.S. Cl.
CPC .......... *H01L 24/33* (2013.01); *H01L 23/3107* (2013.01); *H01L 23/481* (2013.01); *H01L 23/4952* (2013.01); *H01L 23/49861* (2013.01); *H01L 24/09* (2013.01); *H01L 2224/02372* (2013.01); *H01L 2224/02377* (2013.01); *H01L 2224/02379* (2013.01)

(58) Field of Classification Search
CPC .............. H01L 23/3107; H01L 23/481; H01L 23/4952; H01L 23/49861; H01L 24/09; H01L 24/33
USPC .................................................. 257/4, 773
See application file for complete search history.

(56) References Cited

U.S. PATENT DOCUMENTS

| | | |
|---|---|---|
| 7,777,351 B1 | 8/2010 | Berry et al. |
| 2016/0260684 A1 | 9/2016 | Zhai et al. |
| 2016/0260694 A1* | 9/2016 | Chen ..................... H01L 23/481 |

(Continued)

FOREIGN PATENT DOCUMENTS

KR 10-2013-0086347 A 8/2013

*Primary Examiner* — Long K Tran
(74) *Attorney, Agent, or Firm* — Morgan, Lewis & Bockius LLP

(57) ABSTRACT

An electronic component module includes a semiconductor package having a first surface provided as a mounting surface and a second surface opposing the first surface, and including a semiconductor chip, a component package having a first surface facing the second surface of the semiconductor package, and a second surface opposing the first surface of the component package, the component package including a passive component, and a connector disposed on the second surface of the component package and having a connection surface configured to be mechanically coupled to an external device, the connector including a plurality of connection lines arranged on the connection surface.

11 Claims, 16 Drawing Sheets

(56) References Cited

U.S. PATENT DOCUMENTS

2018/0211944 A1\* 7/2018 Kim .................. H01L 25/105
2019/0148250 A1\* 5/2019 Yu .................... H01L 23/3128
                                                    257/773

\* cited by examiner

II1-II1'

PACKAGE-ON-PACKAGE AND PACKAGE CONNECTION SYSTEM COMPRISING THE SAME

CROSS-REFERENCE TO RELATED APPLICATION(S)

This application claims the benefit under 35 USC 119(a) of Korean Patent Application No. 10-2019-0059710 filed on May 21, 2019 in the Korean Intellectual Property Office, the entire disclosure of which is incorporated herein by reference for all purposes.

BACKGROUND

The present inventive concept relates to an electronic component module including a semiconductor chip.

As mobile displays become larger, there is a growing need for an increase in battery capacity. As battery capacity increases, the area occupied by a battery increases. Therefore, it is necessary to reduce the size of a printed circuit board (PCB) provided as a main board. On the other hand, in response to such a demand for a reduction in size, modularization is required in consideration of the mounting area of various components, for example, passive components, as well as semiconductor packages.

SUMMARY

An aspect of the present inventive concept is to provide an electronic component module in which a mounting space of a main board may be reduced.

According to an aspect of the present inventive concept, an electronic component module includes a semiconductor package having a first surface provided as a mounting surface and a second surface, opposing the first surface, and including a semiconductor chip, a component package having a first surface, facing the second surface of the semiconductor package, and a second surface, opposing the first surface of the component package, the component package including a passive component, and a connector disposed on the second surface of the component package and having a connection surface configured to be mechanically coupled to an external device, the connector including a plurality of connection lines arranged on the connection surface.

According to an aspect of the present inventive concept, an electronic component module includes a connection structure having first and second surfaces opposing each other and including a redistribution layer, a semiconductor chip disposed on the first surface of the connection structure and connected to the redistribution layer, an encapsulant disposed on the first surface of the connection structure and encapsulating the semiconductor chip, a first wiring structure connected to the redistribution layer and extending in a direction substantially perpendicular to the first surface, a passive component disposed on the second surface of the connection structure and connected to the redistribution layer, a frame having a first surface in contact with the second surface of the connection structure and a second surface, opposing the first surface, the frame having a through-hole penetrating through the first and second surfaces and accommodating the passive component, a second wiring structure connected to the redistribution layer and penetrating through the first and second surfaces of the frame, and a connector disposed on the second surface of the frame and having a connection surface configured to be mechanically coupled to an external device, the connector including a plurality of connection lines arranged on the connection surface and electrically connected to the second wiring structure.

According to an aspect of the present inventive concept, an electronic component module includes a first frame having a through-hole and including a first wiring structure having a wiring layer disposed on a surface of the first frame; a passive component disposed in the through-hole; a connection member, on which the first frame is disposed, including a redistribution layer which the passive component and the first wiring structure are connected to; a semiconductor chip connected to the redistribution layer, the semiconductor chip and the passive component disposed on opposing sides of the connection member; a connector disposed above the first through-hole, and having connection terminals extending to the wiring layer of the first wiring structure; and electrical connection metal bodies connecting the connection terminals to the wiring layer, respectively.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
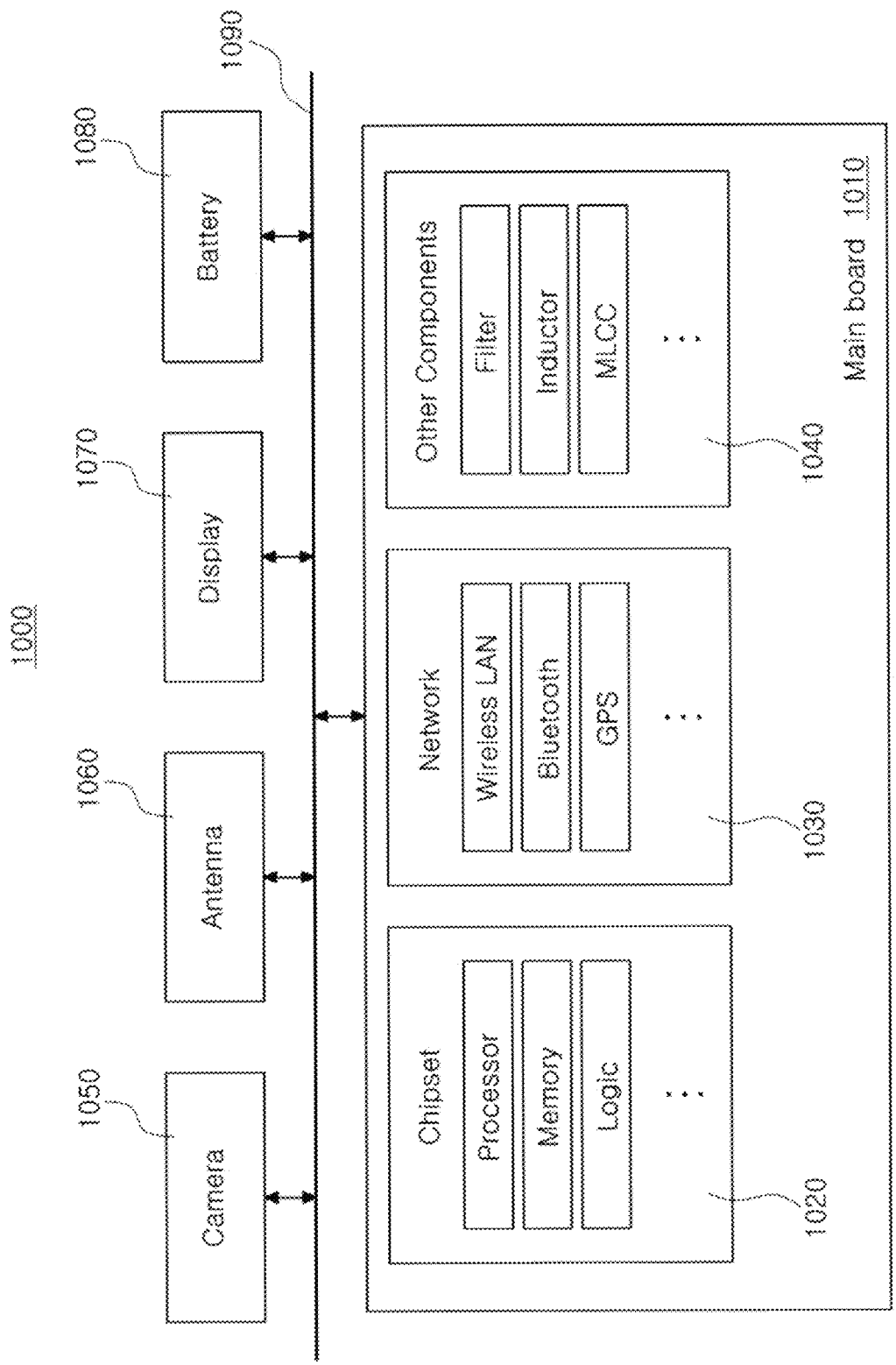
FIG. 1 is a schematic block diagram illustrating an example of an electronic device system.

Hereinafter, example embodiments of the present inventive concept will be described with reference to the accompanying drawings. The shape and size of constituent elements in the drawings may be exaggerated or reduced for clarity.

Electronic Device

FIG. 1 is a schematic block diagram illustrating an example of an electronic device system.

Referring to FIG. 1, an electronic device 1000 may accommodate a main board 1010 therein. The main board 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the main board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
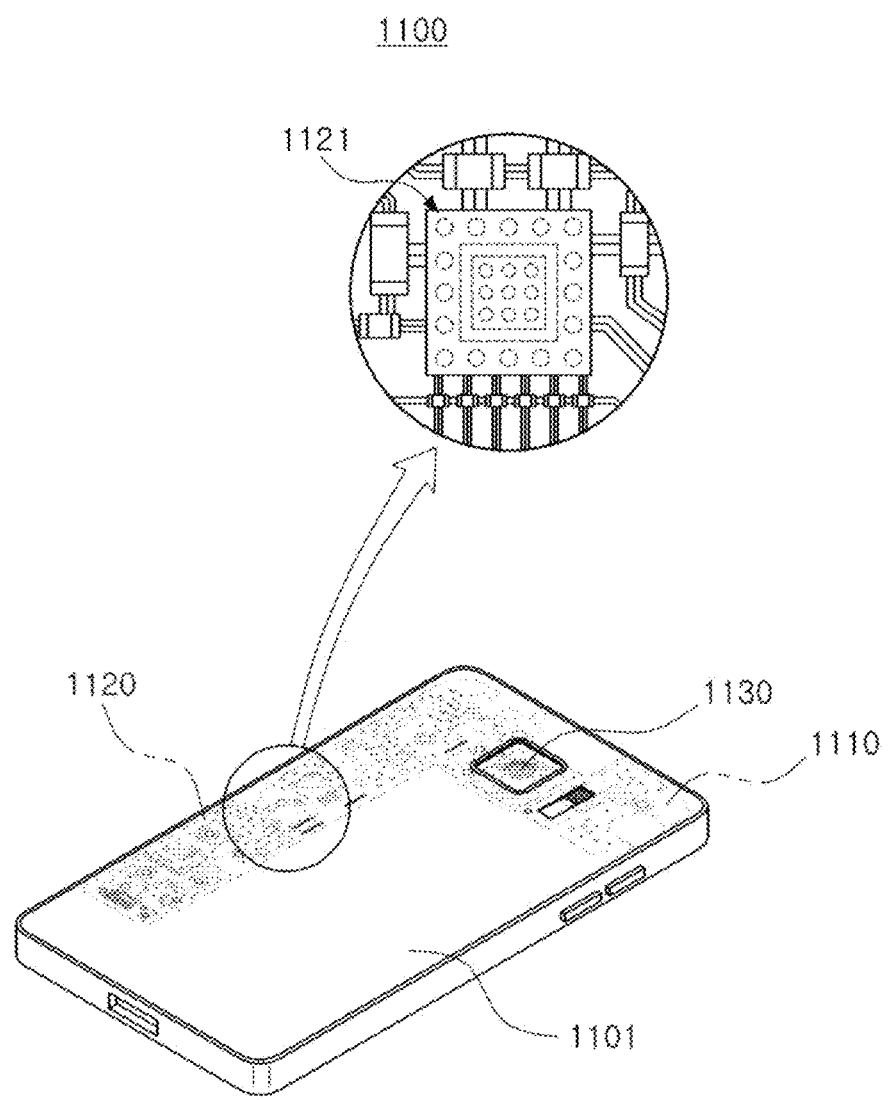
FIG. 2 is a schematic perspective view of an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the main board 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in itself, and may be damaged due to external physical or chemical impact. Therefore, the semiconductor chip may not be used by itself, but is instead packaged and used in an electronic device or the like in a package state.

The reason why semiconductor packaging is commonly used is that there is generally a difference in a circuit width between the semiconductor chip and a main board of the electronic device in terms of electrical connection. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and use of packaging technology for buffering a difference in a circuit width between the semiconductor and the main board is thus advantageous.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3A:
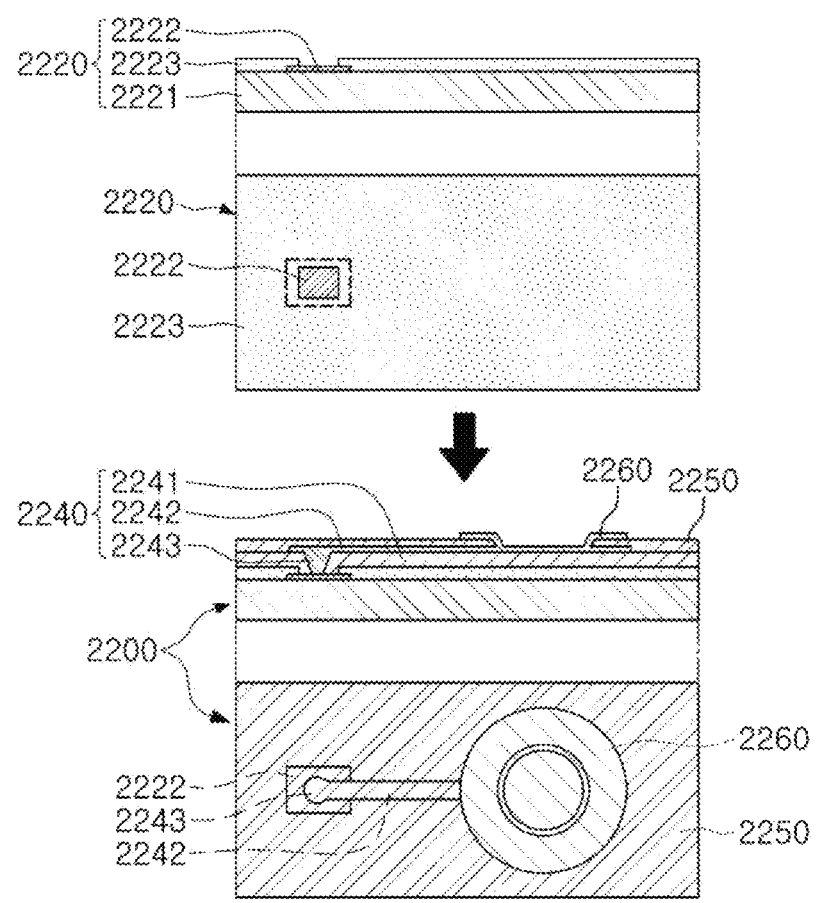
FIGS. 3A and 3B are cross-sectional views schematically illustrating a fan-in semiconductor package before and after packaging, respectively.
Figure 3B:
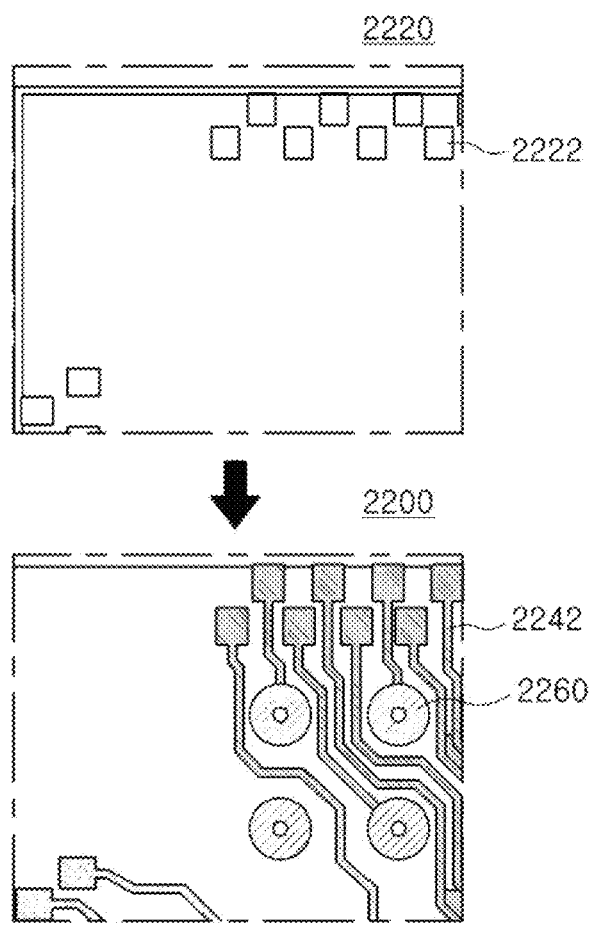
Figure 4:
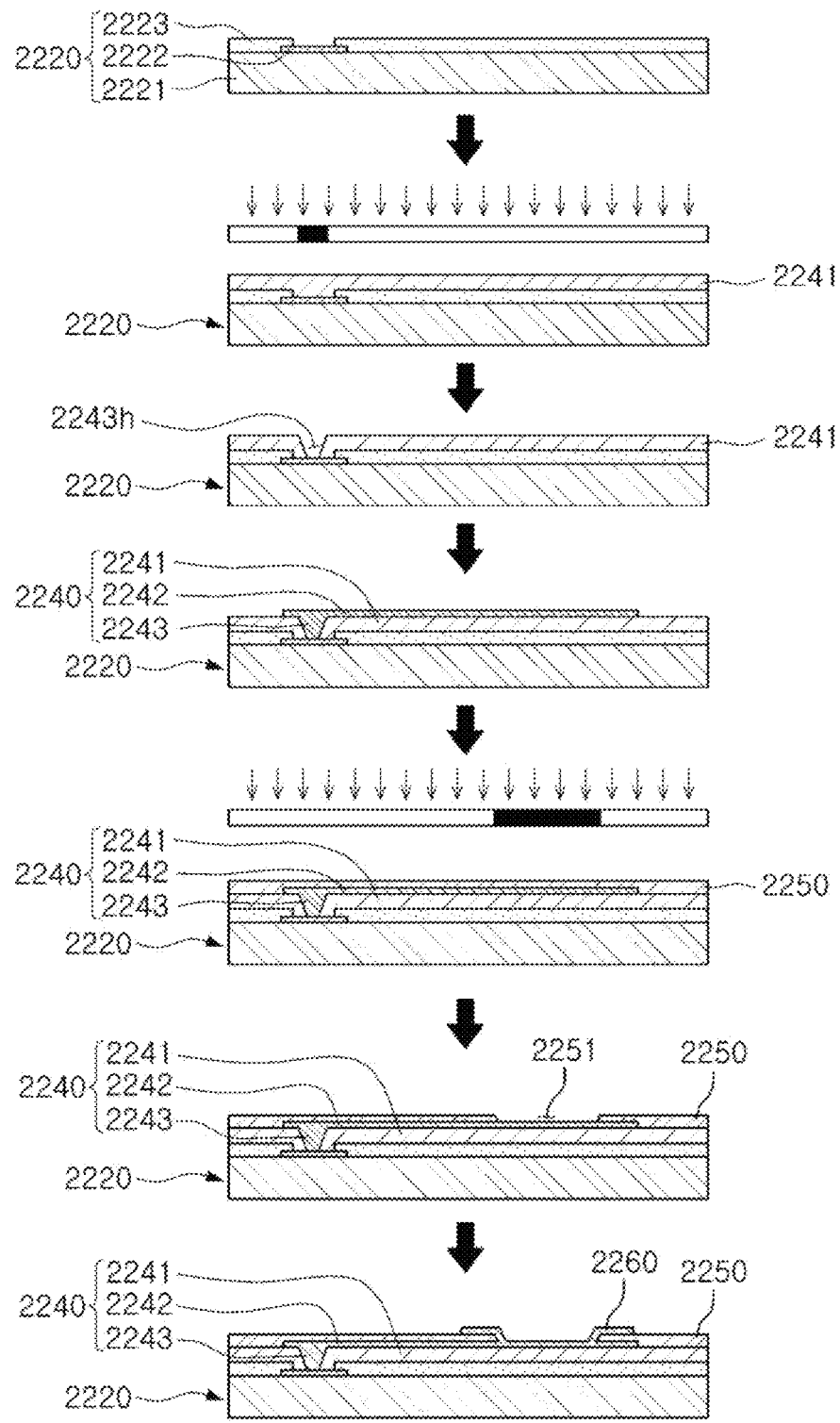
FIG. 4 is a schematic cross-sectional view of a packaging process of a fan-in semiconductor package.

FIGS. 3A and 3B are schematic cross-sectional views illustrating a fan-in semiconductor package before and after being packaged, and FIG. 4 shows a series of schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it may be difficult to mount the integrated circuit (IC) on an intermediate level printed circuit board (PCB) as well as on the main board of the electronic device, or the like.

Therefore, depending on a size of the semiconductor chip 2220, a connection member 2240 may be formed on the semiconductor chip 2220 in order to redistribute the connection pads 2222. The connection member 2240 may be formed by forming an insulating layer 2241 on the semiconductor chip 2220 using an insulating material such as a photoimageable dielectric (PID) resin, forming via holes 2243h opening on to the connection pads 2222, and then forming wiring patterns 2242 and vias 2243. Then, a passivation layer 2250 protecting the connection member 2240 may be formed, and an opening 2251 may be formed to have an underbump metal layer 2260, or the like, extending therethrough. For example, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip, are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals generally need to be disposed inside the semiconductor chip in the fan-in semiconductor package, the fan-in semiconductor package has a large spatial limitation. Therefore, it may be difficult to apply this structure to a semiconductor chip having a large number of I/O terminals or a semiconductor chip having a small size. In addition, due to the disadvantage described above, the fan-in semiconductor package may not be directly mounted and used on the main board of the electronic device. The reason is that even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
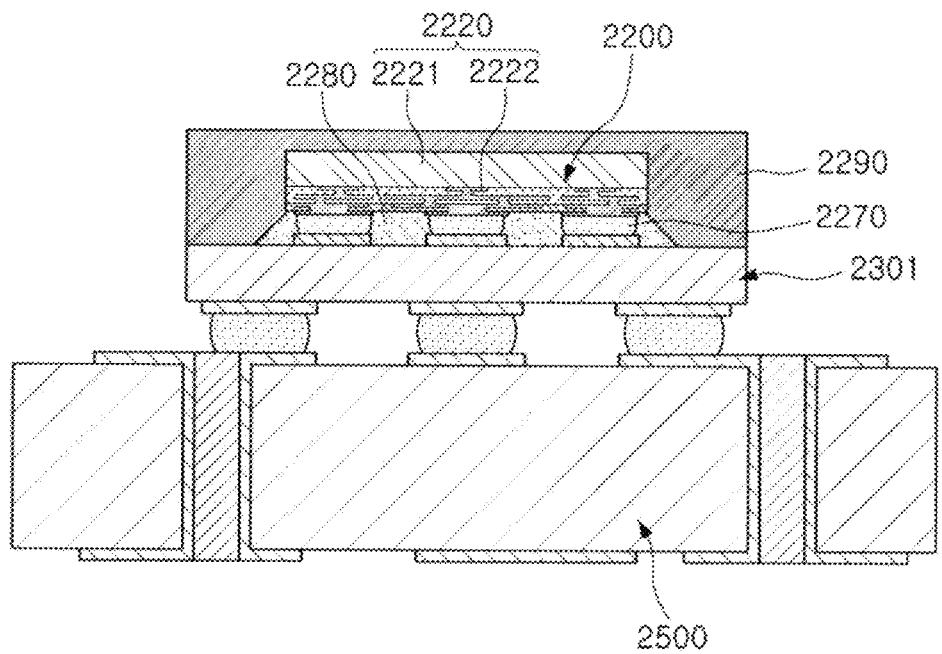
FIG. 5 is a cross-sectional view schematically illustrating a case in which a fan-in semiconductor package is mounted on an interposer substrate to ultimately be mounted on a main board of an electronic device.
Figure 6:
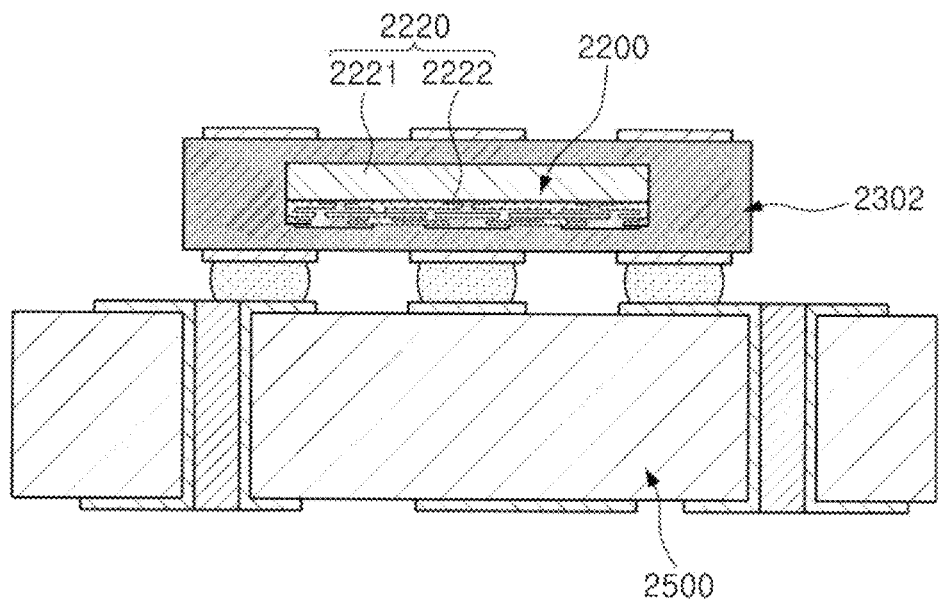
FIG. 6 is a cross-sectional view schematically illustrating a case in which a fan-in semiconductor package is embedded in an interposer substrate to ultimately be mounted on a main board of an electronic device.

FIG. 5 is a schematic cross-sectional view illustrating a fan-in semiconductor package mounted on an interposer substrate for example ultimately mounted on a main board of an electronic device, and FIG. 6 is a schematic cross-sectional view illustrating a fan-in semiconductor package embedded in an interposer substrate for example ultimately mounted on a main board of an electronic device.

Referring to FIGS. 5 and 6, in a fan-in semiconductor package 2200, connection pads 2222, for example, I/O terminals, of a semiconductor chip 2220 may be redistributed once more through an interposer substrate 2301, and the fan-in semiconductor package 2200 may be ultimately mounted on a main board 2500 of an electronic device in a state in which it is mounted on the interposer substrate 2301. In this case, solder balls 2270, and the like, may be fixed by an underfill resin 2280, or the like, and an external surface of the semiconductor chip 2220 may be covered with an encapsulant 2290, or the like. Alternatively, a fan-in semiconductor package 2200 may be embedded in a separate interposer substrate 2302, connection pads 2222, for example, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board (e.g., 2500) of the electronic device. Therefore, the fan-in semiconductor package may be mounted on the separate interposer substrate (e.g., 2301 or 2302) and be then mounted on the main board of the electronic device through a packaging process or may be mounted and used on the main board of the electronic device in a state in which it is embedded in the interposer substrate.

Fan-Out Semiconductor Package

Figure 7:
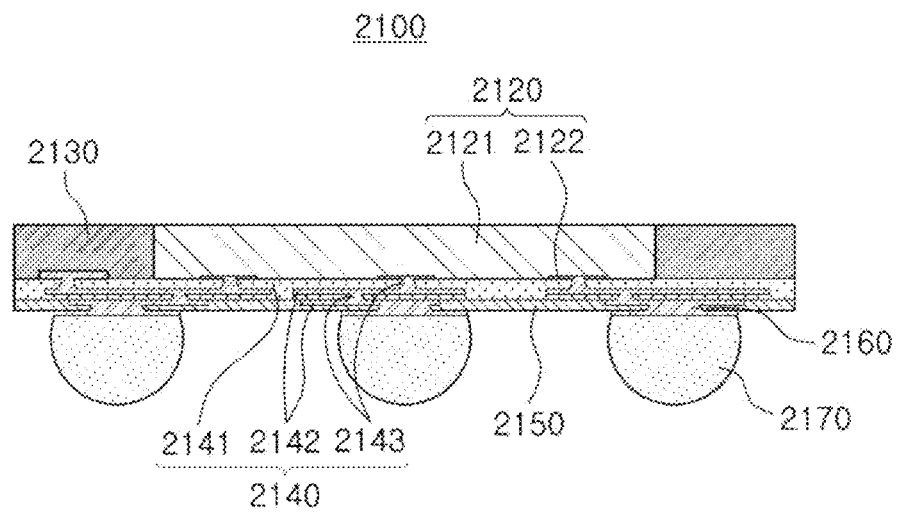
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and an underbump metal layer 2160 may be further formed in openings of the passivation layer 2150. Solder balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

In the present manufacturing process, the connection member 2140 may be formed after the encapsulant 2130 is formed outside the semiconductor chip 2120. In this case, a process for forming the connection member 2140 is performed to form the via(s) connecting the redistribution layers and the connection pads 2122 of the semiconductor chip 2120 to each other and the redistribution layers 2142, and the vias 2143 may thus have a width reduced toward the semiconductor chip 2120 (see an enlarged region).

As described above, the fan-out semiconductor package may have a form in which I/O terminals of the semiconductor chip are redistributed and disposed outwardly of the semiconductor chip 2120 through the connection member 2140 formed on the semiconductor chip 2120. As described above, in the fan-in semiconductor package, all I/O terminals of the semiconductor chip generally need to be disposed inside the semiconductor chip (e.g., within the footprint of the semiconductor chip on the package). Therefore, when a size of the semiconductor chip is decreased, a size and a pitch of balls generally need to be decreased, such that a standardized ball layout may not be used in the fan-in semiconductor package. On the other hand, the fan-out semiconductor package has the form in which the I/O terminals of the semiconductor chip 2120 are redistributed and disposed outwardly of the semiconductor chip 2120 (e.g., outwardly from the footprint of the semiconductor chip) through the connection member 2140 formed on the semiconductor chip as described above. Therefore, even in the case that a size of the semiconductor chip 2120 is decreased, a standardized ball layout may be used in the fan-out semiconductor package as it is, such that the fan-out semiconductor package may be mounted on the main board of the electronic device without using a separate interposer substrate, as described below.

Figure 8:
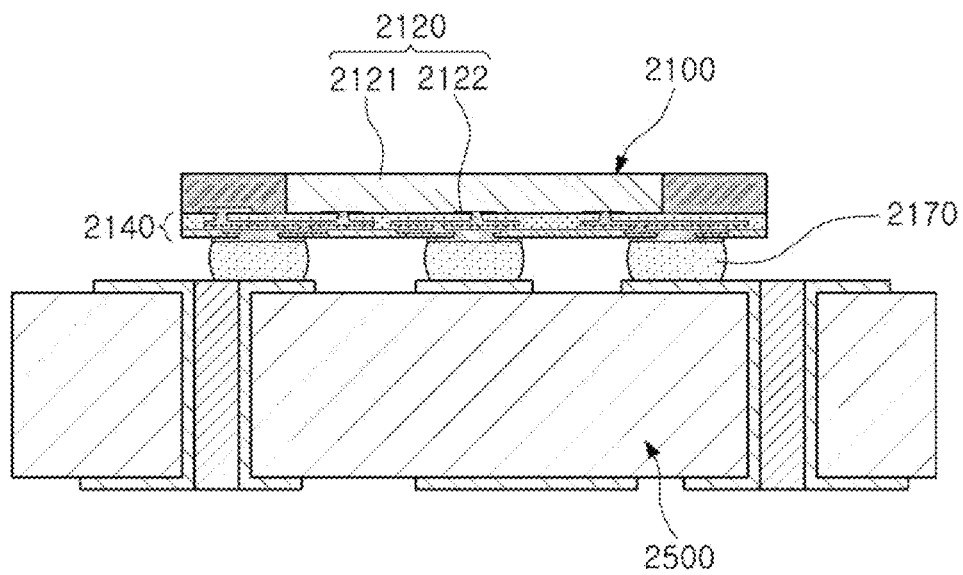
FIG. 8 is a schematic cross-sectional view illustrating a fan-out semiconductor package mounted on a main board of an electronic device.

FIG. 8 is a schematic cross-sectional view illustrating a fan-out semiconductor package mounted on a main board of an electronic device.

Referring to FIG. 8, a fan-out semiconductor package 2100 may be mounted on a main board 2500 of an electronic device through solder balls 2170, or the like. For example, as described above, the fan-out semiconductor package 2100 includes the connection member 2140 formed on the semiconductor chip 2120 and capable of redistributing the connection pads 2122 to a fan-out region for example outside of an area/footprint of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem caused by the occurrence of a warpage phenomenon.

Meanwhile, the fan-out semiconductor package refers to a packaging technology for mounting the semiconductor chip on the main board of the electronic device, or the like, as described above, and protecting the semiconductor chip from external impacts. The fan-out semiconductor package is a concept different from that of a printed circuit board (PCB) such as an interposer substrate, or the like, having a scale, a purpose, and the like, different from those of the fan-out semiconductor package, and having the fan-in semiconductor package embedded therein.

Figure 9:
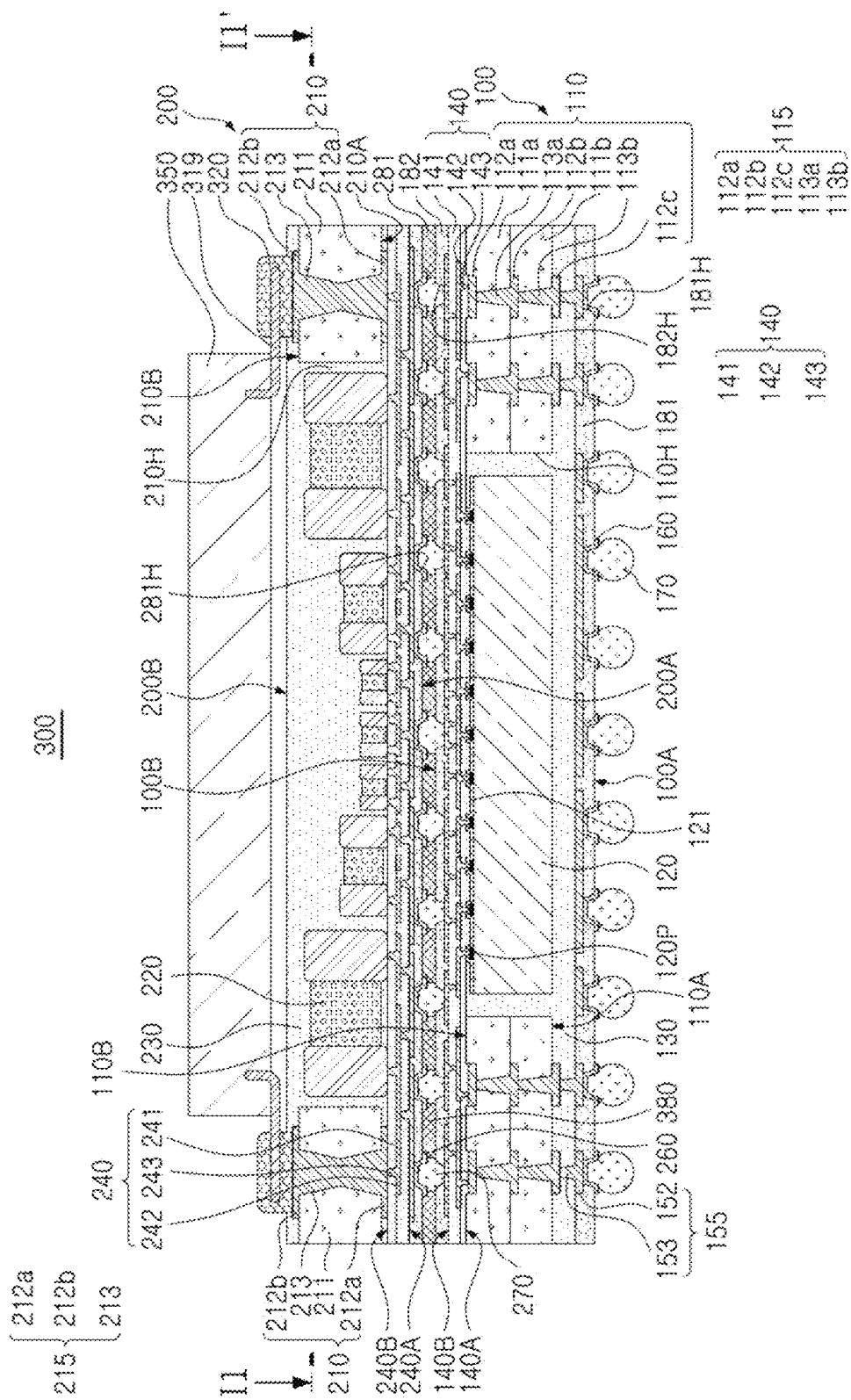
FIG. 9 is a schematic cross-sectional view of an electronic component module according to an example embodiment of the present inventive concept.
Figure 10:
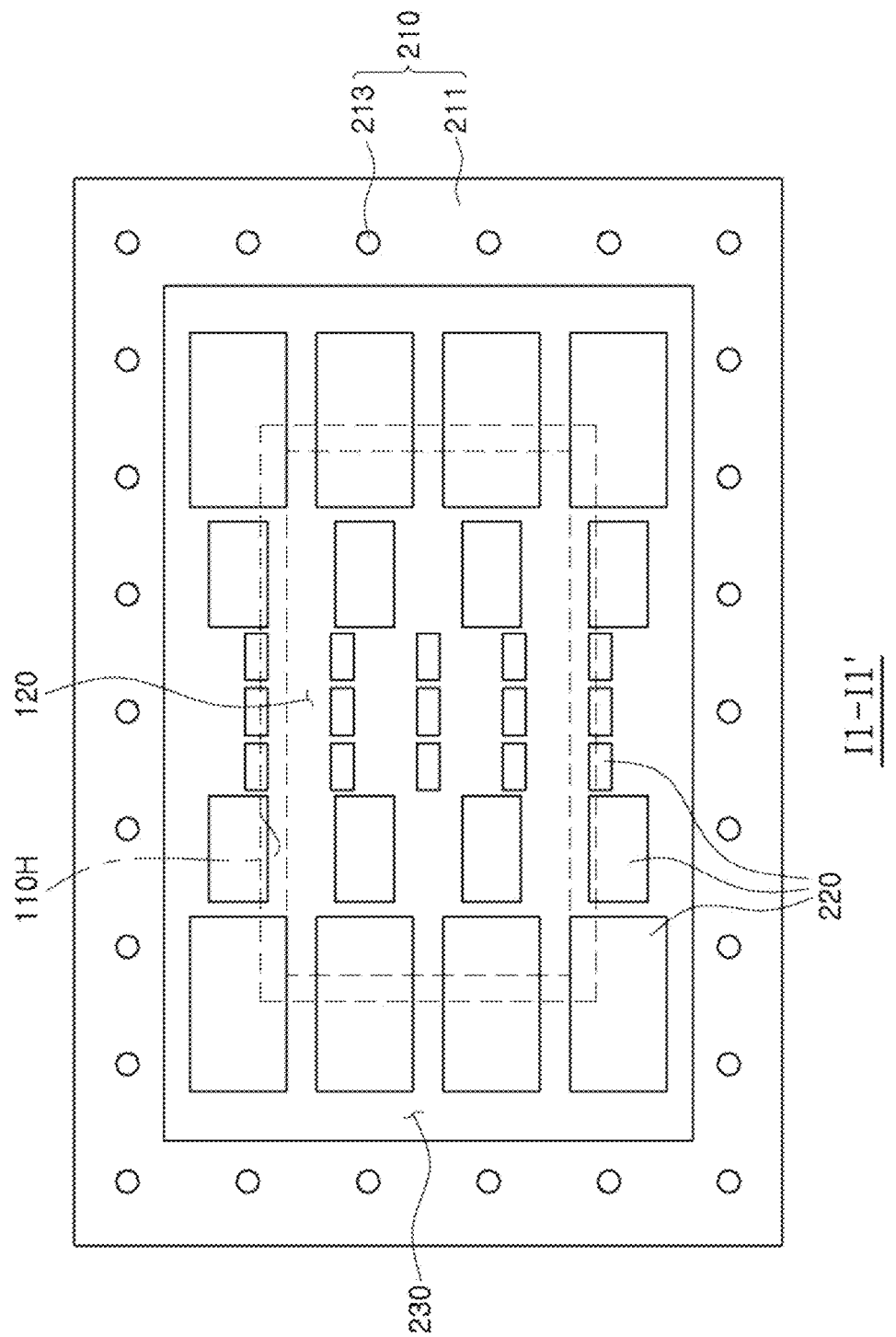
FIG. 10 is a plan view of the electronic component module of FIG. 9, taken along line I1-I1' in FIG. 9.

FIG. 9 is a schematic cross-sectional view of an electronic component module according to an example embodiment, and FIG. 10 is a plan view of the electronic component module, taken along line I1-I1' in FIG. 9.

Referring to FIGS. 9 and 10, an electronic component module 300 according to an example embodiment includes a semiconductor package 100 having a first surface 100A provided as a mounting surface and a second surface 100B opposing the first surface 100A, a component package 200 having a first surface 200A facing the second surface 100B of the semiconductor package 100 and a second surface 200B opposing the first surface 200A, and a connector 350 disposed on the second surface 200B of the component package 200.

The semiconductor package 100 employed in this embodiment includes a first connection structure 140 having a first surface 140A and a second surface 140B opposing each other and including a first redistribution layer 142, a semiconductor chip 120 disposed on the first surface 140A of the first connection structure 140 and including a connection pad 120P connected to the first redistribution layer 142, and a first encapsulant 130 disposed on the first surface 140A of the first connection structure 140 and encapsulating the semiconductor chip 120. The second surface 140B of the first connection structure 140 may be provided as the second surface 100B of the semiconductor package 100.

The first redistribution layer 142 of the first connection structure 140 may be implemented on two levels of a plurality of (for example, two) insulating layers 141, but an example embodiment thereof is not limited thereto. In some embodiments, the first redistribution layer 142 may be formed of a single layer or a plurality of different layers. The first redistribution layer 142 may be connected to the connection pad 120P of the semiconductor chip 120 by a first redistribution via 143 penetrating through the insulating layer 141.

The semiconductor package 100 employed in this embodiment may further include a first frame 110 having first and second surfaces 110A and 110B opposing each other and including a first wiring structure 115 connecting the first and second surfaces 110A and 110B. The first frame 110 may have a through-hole 110H accommodating the semiconductor chip 120. In another embodiment, a structure of a receiving portion for the semiconductor chip 120 may be changed to another structure (see FIG. 14). The second surface 110B of the first frame 110 may be in contact with the first surface 140A of the first connection structure 140.

In the example embodiment, the first frame 110 includes first and second insulating layers 111*a* and 111*b,* and the first wiring structure 115 includes three wiring layers 112*a,* 112*b* and 112*c,* and may include first and second wiring vias 113*a* and 113*b* connecting the three wiring layers 112*a,* 112*b* and 112*c* to each other, but an example embodiment thereof is not limited thereto. In some embodiments, the first wiring structure 115 may be formed to have the number of layers and structure different therefrom. The first wiring structure 115 (in detail, first wiring layer 112*a*) of the first frame 110 may be electrically connected to the first redistribution layer 142 of the first connection structure 140 by the first redistribution via 143.

The semiconductor package 100 employed in this embodiment further includes a third redistribution layer 152 disposed on the first surface 110A of the first frame 110 and the first encapsulant 130.

The third redistribution layer 152 may be connected to the first wiring structure 115, in detail, third wiring layer 112c, by a third redistribution via 153 penetrating through the first encapsulant 130. In this embodiment, the side on which the third redistribution layer 152 is formed may be provided as the first surface 100A of the semiconductor package 100, for example, the mounting surface. In another embodiment, the third redistribution layer 152 is illustrated as a single layer, but in some embodiments, further includes an insulating layer (not illustrated) and may be implemented on two or more levels.

The component package 200 employed in this embodiment includes a second connection structure 240 having first and second surfaces 240A and 240B opposing each other and having a second redistribution layer 242, a passive component 220 disposed on the second surface 240B of the second connection structure 240 and electrically connected to the second redistribution layer 242, and a second encapsulant 230 disposed on the second surface 240B of the second connection structure 240 and encapsulating the passive component 220.

The first surface 200A of the component package 200, in detail, the first surface 240A of the second connection structure 240 may be in contact with the second surface 100B of the semiconductor package 100, in detail, the second surface 140B of the first electrode 140.

The second connection structure 240 includes a plurality of insulating layers 241, and the second redistribution layer 242 may be implemented on two levels of a plurality of (for example, two) insulating layers 241, similarly to the first redistribution layer 142. The structure of the second connection structure 240 is not limited thereto. In some embodiments, the insulating layer 241 and the second redistribution layer 242 may be implemented as a single layer or three or more layers. The passive component 220 disposed on the first surface 240A of the second connection structure 240 may be connected to the second redistribution layer 242 by the second redistribution via 243 penetrating through the insulating layer 241.

The component package 200 employed in this embodiment may include a second frame 210 having a through-hole 210H accommodating the passive component 220. The second frame 210 has first and second surfaces 210A and 210B opposing each other, and the second surface 210B of the second frame 210 may be in contact with the first surface 240A of the second connection structure 240.

The second frame 210 may include an insulating member 211 and a second wiring structure 215 penetrating through the insulating member 211. The second wiring structure 215 may be connected to the second redistribution layer 242 of the second connection structure 240 by the second redistribution via 243 penetrating through the insulating layer 241.

Figure 11:
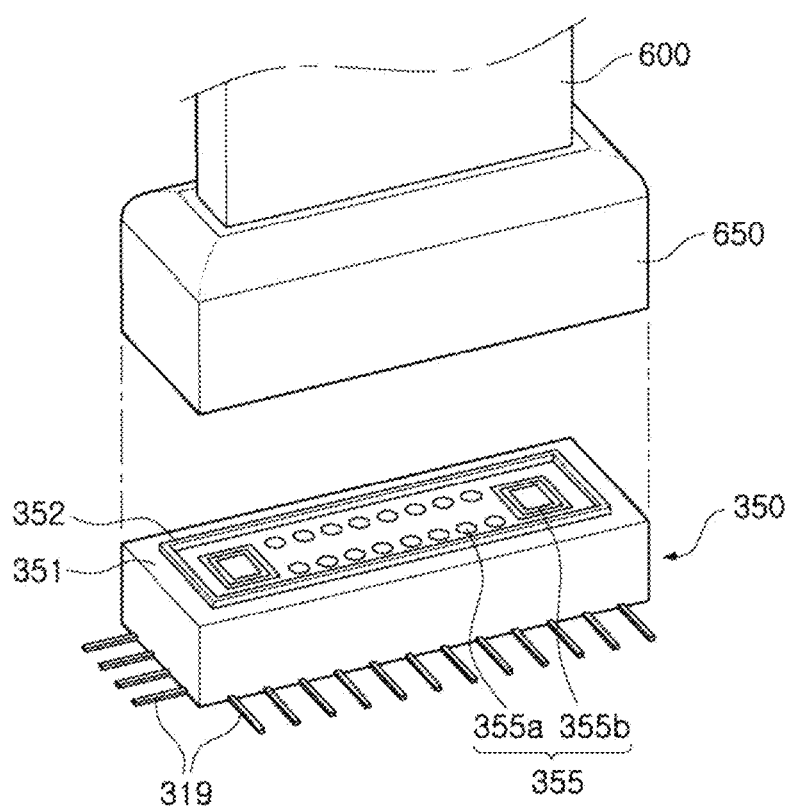
FIG. 11 is a perspective view illustrating an example of a connector that may be employed in the electronic component module illustrated in FIG. 9.

The connector 350 employed in this embodiment may be disposed on the component package 200, for example, on the second surface 210B of the second frame 210. FIG. 11 is a perspective view illustrating an example of the connector 350 that may be employed in the electronic component module 300 of FIG. 9.

Referring to FIG. 11, the connector 350 may have a connection surface 351 configured to be mechanically coupled to a connector 650 of an external device 600. A plurality of connection lines 355 may be arranged on the connection surface 351 to be connected to corresponding connection lines (not illustrated) of an external device, for example, a rigid-flexible printed circuit board (PCB) 600. The plurality of connection lines 355 may include a signal line 355a and a power line 355b.

The connector 350 may be detachably coupled to the connector 650 of the external device 600. For example, the connector 350 may have a coupling portion 352 for example detachable from the connector 650 of the external device 600 on the connection surface 351. In some embodiments, the plurality of connection lines 355 may be embodied as protruding pins or recessed grooves, respectively, and may be removably coupled to corresponding connection lines (not illustrated) of the external device 600, configured as a recessed groove or a protruding pin, to secure electrical and mechanical connection. In another embodiment, the connector 350 may be configured to be detachably coupled by a separate fixing unit, and in a coupled state, the plurality of connection lines 355 may be electrically connected to the external device 600.

The connector 350 may include a plurality of external connection terminals 319 electrically connected to the second wiring structure 215. The plurality of external connection terminals 319 may be associated with a plurality of connection lines 355, respectively. For example, the plurality of external connection terminals 319 may be provided as a plurality of fins. The plurality of external connection terminals 319 may be connected to the second wiring structure 215, in detail, second wiring layer 212b, by a third electrical connection metal body 320 such as a low melting point metal.

In this structure, each connection line 355 of the connector 350 may be electrically connected to the passive component 220 and the semiconductor chip 120, through a circuit structure of the component package 200, such as the second wiring structure 215 and the second redistribution layer 242, and a circuit structure of the semiconductor package 100, such as the first wiring structure 115, the first redistribution layer 142, and the third redistribution layer 152. In addition, each connection line 355 of the connector 350 may be connected to another external device, for example, a main board, through a first electrical connection metal body 170 connected to the third redistribution layer 152 located on the mounting surface of the semiconductor package 100.

The electronic component module 300 according to the example embodiment may reduce the mounting space of the passive component 210 by disposing the component package 200 having the passive component 220 on an upper portion of the semiconductor package 100, and further, may reduce noise by shortening an electrical connection path between the passive component 220 and the semiconductor chip 120.

In addition, the electronic component module 300 according to the example embodiment may be configured to have an uppermost structure, for example, an upper structure of the component package 200, in which the connector 350 is introduced in such a manner that a region for the connector 350 overlaps the mounting space of the electronic component module 300. In this case, since a region for the connector 350 is not required on the main board, the area of the main board may be reduced. A detailed description thereof will be given later with reference to FIGS. 12A and 12B.

As described above, according to the example embodiment, since the passive component 220 occupying a considerable space of the main board and the connector area may be omitted, the area of an electronic device may be significantly reduced.

Hereinafter, main configurations of the electronic component module 300 according to the example embodiment will be described in more detail.

The first and second frames 110 and 210 may improve rigidity of the semiconductor package 100 and the component package 200 depending on a specific material, and may secure uniformity of thickness of the first and second encapsulants 130 and 230. The first and second frames 110 and 210 have the first and second wiring structures 115 and 215 as described above, and may thus be utilized as package structures of a package-on-package (POP)-type. Thus, an exemplary embodiment thereof may be modified in other forms, and other functions may be performed depending on the forms.

As described above, the first frame 110 includes a first insulating layer 111a in contact with the first connection structure 140, a first wiring layer 112a in contact with the first connection structure 140 and embedded in the first insulating layer 111a, a second wiring layer 112b disposed on a side of the first insulating layer 111a, opposite to a side thereof on which the first wiring layer 112a is embedded, a second insulating layer 111b disposed on the first insulating layer 111a and covering the second wiring layer 112b, and third wiring layer 112c disposed on the second insulating layer 111b. The first to third wiring layers 112a, 112b and 112c are electrically connected to a connection pad 122. The first to third wiring layers 112a, 112b and 112c are electrically connected to each other, through first and second wiring vias 113a and 113b penetrating through the first and second insulating layers 111a and 111b, respectively.

In the case of the first frame employed in this embodiment, since the first wiring layer 112a is embedded in the first insulating layer 111a, a step generated by a thickness of the first wiring layer 112a may be significantly reduced, an insulation distance of the first connections structure 140 may be more constant. The first wiring layer 112a may have the step between a lower surface of the first insulating layer 111a and a lower surface of the first wiring layer 112a as the first insulating layer 111a is recessed therein. In this case, a material of the first encapsulant 130 may be prevented from bleeding to contaminate the first wiring layer 112a.

The second frame 210 includes an insulating member 211 disposed on the second connection structure 240, first and second wiring layers 212a and 212b disposed on both surfaces of the insulating member 211, respectively, and a wiring via 213 penetrating through the first and second wiring layers 212a and 212b. The first wiring layer 212a may be connected to the second redistribution layer 242 by a second redistribution via 243.

The first and second frames 110 and 210 may be manufactured to have a sufficient thickness by a process of manufacturing a printed circuit board, while the first and second connection structures 140 and 240 may be manufactured by a semiconductor process or the like, to have a relatively reduced thickness. Therefore, the thicknesses of each of the first to third wiring layers 112a, 112b and 112c of the first frame 110 and the first and second wiring layers 212a and 212b of the second frame 210 may be greater than a thickness of each of the first redistribution layer 142 of the first connection structure 140 and the second redistribution layer 242 of the second connection structure 240.

In some other embodiments, the first and/or second connection structure 140, 240 may also be manufactured by a printed circuit board manufacturing process similar to that of the first and second frames 110 and 210. In this case, the thickness of each of the first to third wiring layers 112a to 112c of the first frame 110 and the thickness of each of the first and second wiring layers 212a and 212b of the second frame 210 may be similar to a thickness of each of the first redistribution layer 142 and the second redistribution layer 242.

In some embodiments, the first and second insulating layers 111a and 111b and the insulating member 211 may be formed of a thermosetting resin such as epoxy resin, a thermoplastic resin such as polyimide, or a mixture of these resins with an inorganic filler, or a resin in which these resins are impregnated with a core material such as a glass fiber, a glass cloth, a glass fabric, or the like, together with an inorganic filler, for example, a prepreg resin, Ajinomoto Bulid-up Film (ABF) resin, FR-4 resin, Bismaleimide Triazine (BT) resin, or the like. In some embodiments, a photoimageable dielectric (PID) resin may be used. A prepreg may be used in terms of rigidity maintenance.

The first to third wiring layers 112a to 112c serve to redistribute the connection pads 122 of the semiconductor chip 120. The first and second wiring layers 212a and 212b may serve to redistribute passive components. The first to third wiring layers 112a, 112b and 112c and the first and second wiring layers 212a and 212b may include a conductive material such as copper (Cu), aluminum (Al), silver (Ag), tin (Sn), gold (Au), nickel (Ni), lead (Pb), titanium (Ti), or alloys thereof. The first to third wiring layers 112a, 112b and 112c and the first and second wiring layers 212a and 212b may perform various functions according to the design of a corresponding layer, and for example, may include a ground (GND) pattern, a power (PoWeR: PWR) pattern, a signal (S) pattern or the like. In this case, the signal S pattern includes various signals except for a ground (GND) pattern, a power (PWR) pattern, and the like, for example, includes a data signal and the like. At least one of the first to third wiring layers 112a, 112b and 112c and/or at least one of the first and second wiring layers 212a and 212b may also include via pads, wire pads, ball pads, and the like.

The first and second wiring vias 113a and 113b and the wiring vias 213 are provided in an interlayer connection structure in the first and second frames 110 and 210, respectively. The first and second wiring vias 113a and 113b and the wiring vias 213 may also use the conductive material described above. The first and second wiring vias 113a and 113b and the wiring vias 213 may be filled vias, filled with a conductive material, or may be conformal vias formed as a conductive material is formed along wall surfaces of via holes. On the other hand, according to the process, the first and second wiring vias 113a and 113b may have a taper shape tapered in the same direction, for example, a taper shape having an upper width less than a lower width with respect to a cross section. The first and second wiring vias 113a and 113b may be integrated with the second and third wiring layers 112b and 112c by the same plating process, respectively.

The semiconductor chip 120 may be an integrated circuit (IC) in which hundreds to millions of devices are integrated in a single chip. In this case, the integrated circuit may be, but is not limited to, a processor chip, such as a central processor (for example, a central processing unit (CPU)), a graphics processor (for example, a graphics processing unit (GPU)), a field programmable gate array (FPGA), a digital signal processor, a cryptographic processor, a microprocessor, a microcontroller, or the like, in detail, may be an application processor (AP), or may be a memory chip such as, for example, a volatile memory such as a dynamic random access memory (DRAM), a nonvolatile memory such as a read only memory (ROM), a flash memory or the like, or may be a logic chip such as an analog-digital converter or the like, or may be another type of chip such as a power management integrated circuit (PMIC), or may be a combination of some thereof.

The semiconductor chip 120 may be formed on the basis of an active wafer. In this case, a base material of a body 121 may be silicon (Si), germanium (Ge), gallium arsenic (GaAs) or the like. A variety of circuits may be formed in the body. A connection pad 121P is provided to electrically connect the semiconductor chip 120 to other components, and as a formation material thereof, a conductive material such as aluminum (Al), copper (Cu), or the like may be used without any particular limitation. A passivation film 121 may be formed on an active surface of the body, to expose the connection pad 120P. The passivation film 121 may be an oxide film, a nitride film or the like, or may be a double layer of an oxide film and a nitride film. A lower surface of the connection pad 120P may have a step with a lower surface of the first encapsulant 130 through the passivation film 121, and thus, the first encapsulant 130 may fill at least a portion of a space between the passivation film 121 and the first connection structure 140. In this case, the first encapsulant 130 may be prevented, to some extent, from bleeding to a lower surface of the connection pad 120P. An insulating film (not illustrated) or the like may further be disposed in other required positions. The semiconductor chip 120 may be a bare die such that the connection pad 120P may physically contact the first redistribution via 143 of the first connection structure 140. Depending on the type of the semiconductor chip 120, a separate redistribution layer (not illustrated) may be further formed on the active surface of the semiconductor chip 120, and bumps (not illustrated) or the like may be connected to the connection pad 120P.

The first encapsulant 130 may protect the first frame 110, the first semiconductor chip 120, and the like. Similarly, the second encapsulant 230 may protect the second frame 210, the passive component 220, and the like. An encapsulating form thereof is not particularly limited, and may be in the form of wrapping at least a portion of the object to be protected. The first and second encapsulants 130 and 230 fill the through-holes 110H and 210H to function as an adhesive depending on a detailed material of the first and second encapsulants 130 and 230 and to reduce buckling.

The material of the first and second encapsulants 130 and 230 is not limited thereto. For example, a thermosetting resin such as an epoxy resin, a thermoplastic resin such as polyimide, or a resin in which these resins are mixed with an inorganic filler, a resin in which these resins are impregnated with a core material such as a glass fiber or the like, together with an inorganic filler, may be used. In some embodiments, as the first and second encapsulants 130 and 230, a curable resin or a photoimageable encapsulant (PIE) resin such as a prepreg resin, ABF resin, FR-4 resin, BT resin, or the like, may be used.

The third redistribution layer 152 may be disposed on the first encapsulant 130 as described above, to be connected to the wiring structure of the first frame 110, in detail, to the third wiring layer 112c. The third redistribution via 153 penetrates through at least a portion of the first encapsulant 130 and electrically connects the third wiring layer 112c which is an uppermost wiring layer of the first frame 110, and the third redistribution layer 152. A material of formation of the third redistribution layer 152 and the third redistribution via 153 may include a conductive material as described above, and may also include a metal such as copper (Cu) in some embodiments. Each of the third redistribution layer 152 and the third redistribution via 153 may be a plurality of conductor layers each composed of a seed layer and a plating layer. The third redistribution layer 152 may perform various functions according to design. For example, the third redistribution layer 152 may include, for example, a ground pattern, a power pattern, a signal pattern, and the like. The third reed via 153 may also have a tapered shape having a width of an upper surface less than a width of a lower surface with respect to a cross section.

The first connection structure 140 may redistribute the connection pads 122 of the semiconductor chip 120. Several tens to several hundreds of the connection pads 120P of the semiconductor chip 120 having various functions may be redistributed through the first connection structure 140, and may be physically and/or electrically connected externally through the first electrical connection metal body 170, depending on the function thereof.

As a material of the insulating layer 141 of the first connection structure 140, a photoimageable dielectric material such as a PID resin in addition to the above-described insulating material may be used. When the insulating layer 141 has photoimageable properties, the insulating layer 141 may be formed to have a relatively reduced thickness, and a fine pitch of the connection vias 143 may be more easily obtained, using a photolithography process. In some embodiments, the insulating layer 141 may be a photoimageable dielectric layer including an insulating resin and an inorganic filler. For example, when the insulating layer 141 is comprised of multiple layers, materials of multiple layers may be the same as each other, and as required, may be different from each other. Although the insulating layer 141 is composed of multiple layers, boundaries between the layers thereof may be unclear depending on the process.

The first redistribution layer 142 may substantially redistribute the connection pads 122, and the conductive material described above may be used as a material thereof. The first redistribution layer 142 may perform various functions according to the design of a corresponding layer, and for example, may include a ground pattern, a power pattern, a signal pattern, and the like. In this case, the signal pattern includes various signals except for a ground pattern, a power pattern, and the like, for example, includes a data signal and the like, and may include pad patterns of various shapes as required. The conductive material described above may also be used as a material of the first redistribution via 143. The first redistribution via 143 may be completely filled with a conductive material, or may be formed as a conductive material is formed along a wall of a via. Each constitution of the second connection structure 240 may also be manufactured with similar materials and processes as those of the first connection structure 140.

The via 143 of the first connection structure 140 may have a shape tapered in a direction opposite to a direction in which the first and second wiring vias 113a and 113b of the frame 110 are tapered. For example, the via 143 may have a tapered shape in which a width of an upper surface is greater than a width of a lower surface with respect to a cross section.

First and second passivation layers 181 and 182 of the semiconductor package 100 and a first passivation layer 281 of the component package 200 may include, for example, prepreg, ABF, FR-4, BT, solder resist or a PID. The first and second passivation layers 181 and 182 of the semiconductor package 100 and the first passivation layer 281 of the component package 200 may include a plurality of openings 181H, 182H, and 281H for electrical connection.

In detail, a plurality of openings 181H are formed in the first passivation layer 181 of the semiconductor package 100 to expose a portion of the third redistribution layer 152, and a first under bump metal layer 160 is formed to be connected to a portion of the third redistribution layer 152 through the plurality of openings 181H, and the first electrical connection metal body 170 may be formed.

Similarly, a plurality of openings 281H are formed in the first passivation layer 281 of the component package 200 to expose a portion of the second redistribution layer 242, and a second under bump metal layer 260 is formed to be connected to a portion of the second redistribution layer 242 through the plurality of openings 281H, and a second electrical connection metal body 270 may be formed. A plurality of openings 182H are formed in the second passivation layer 182 of the semiconductor package 100 to expose a portion of the first redistribution layer 142, and the second connection metal body 270 may be connected to a portion of the first redistribution layer 142 through the plurality of openings 182H.

An underfill 380 surrounding the second electrical connection metal body 270 fills a gap between the second surface 140B of the first connection structure 140 and the first surface 240A of the second connection structure 240, such that the semiconductor package 100 and the component package 200 may be firmly coupled to each other.

The first and second under bump metal layers 160 and 260 may be formed in the openings of the first passivation layers 181 and 281, using a known conductive material such as a metal, by a known metallization method, but an example embodiment thereof is not limited thereto. The number, spacing, arrangement type, and the like of the first and second electrical connection metal bodies 170 and 270 are not particularly limited and may be sufficiently modified depending on design specifications for those skilled in the art. For example, the number of the first electrical connection metal bodies 170 may be several tens to several thousands depending on the number of the connection pads 120P, and may be more or less numbers.

The first and second electrical connection metal bodies 170 and 270 serve to physically and/or electrically connect the semiconductor package 100 to an external device such as a main board of an electronic device. The first and second electrical connection metal bodies 170 and 270 may include a low-melting point metal, for example, a solder of tin (Sn)-Aluminum (Al)-copper (Cu) or the like. The first electrical connection metal body 170 may be a multilayer or a single layer. For example, the multilayer may include a copper pillar and solder, and the single layer may include tin-silver solder or copper.

The first and second electrical connection metal bodies 170 and 270 are illustrated in a ball shape, but may have a structure having another constant height such as in a land or a pin. Therefore, a certain mounting space may be secured on the lower surface of the insulating layer 141 by a height of the first electrical connection metal body 170.

The electronic component module 300 according to the example embodiment employs a connector as an uppermost structure, thereby significantly reducing the main board. In detail, referring to FIGS. 12A and 12B, the miniaturization effect of the main board by an electronic component module according to the example embodiment will be described.

Figure 12A:
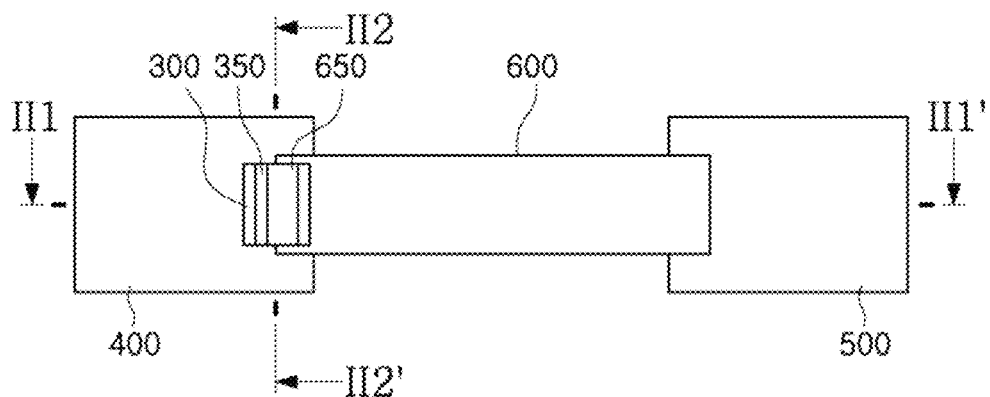
FIG. 12A is a plan view illustrating an example of a display assembly as an application example of the electronic component module of FIG. 9 according to an example embodiment of the present inventive concept.
Figure 12B:
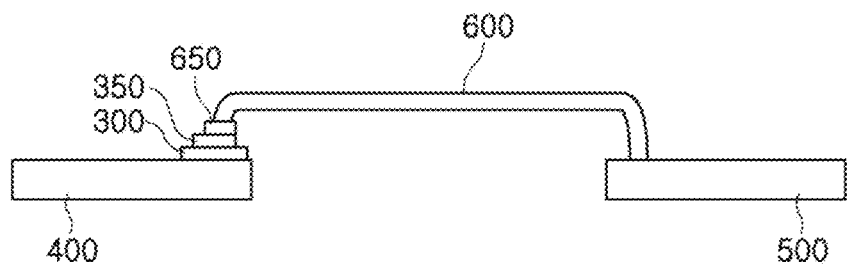
FIG. 12B is a cross-sectional view of the display assembly, taken along line III1-III1' of FIG. 12A.
Figure 13:
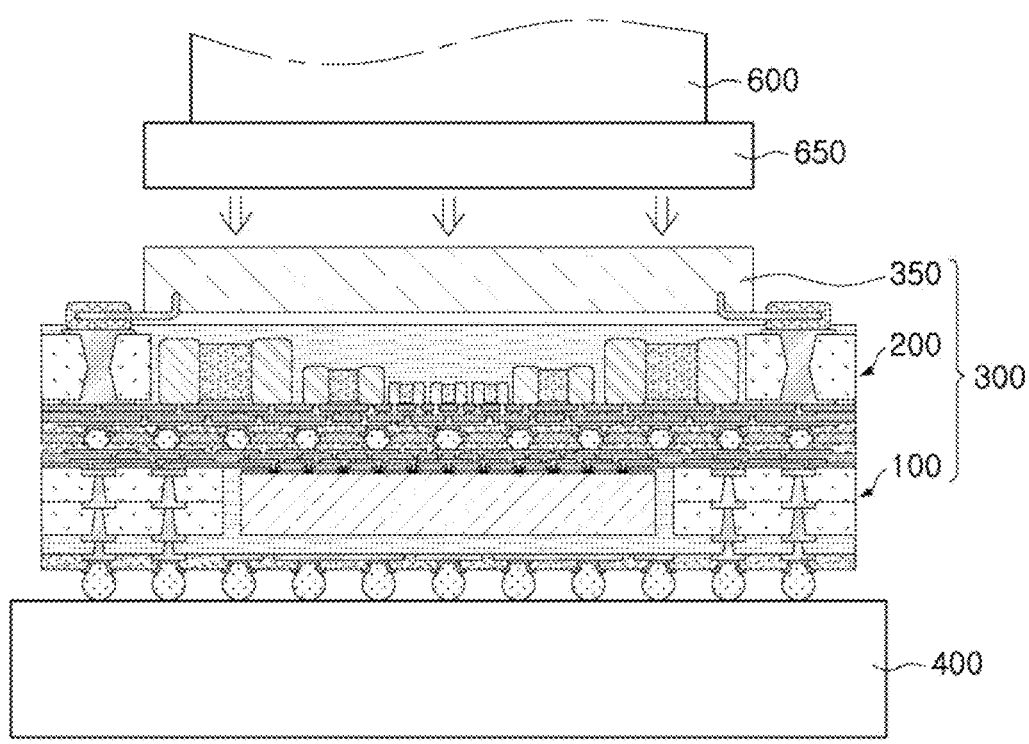
FIG. 13 is a cross-sectional view taken along line II2-II2' of FIG. 12A.

FIG. 12A is a plan view illustrating an example of a display assembly as an application example of the electronic component module of FIG. 9 according to an example embodiment of the present inventive concept, and FIG. 12B is a cross-sectional view of the display assembly, taken along line II1-II1' of FIG. 12A. FIG. 13 is a cross-sectional view of the display assembly of FIG. 12A taken along line II2-II2'.

Referring to FIGS. 12A and 12B, an electronic device may include a main board 400, a display panel 500, and a rigid-flexible printed circuit board (RF-PCB) 600 connecting the main panel 400 and the display panel 500.

The connector 650 of the rigid-flexible PCB 600 may be coupled to the connector 350 for the main board 400 to ensure power/signal connection between the display panel 500 and the main board 400. Such an electronic device may be a mobile device.

As illustrated in FIG. 13, the electronic component module 300 mounted on the main board 400 includes the semiconductor package 100 having a semiconductor chip such as a power management IC (PMIC) chip, and the component package 200 disposed thereon and including passive components. The detailed configuration of the electronic component module 300 may be understood with reference to FIGS. 9 to 11.

The electronic component module 300 according to the example embodiment employs the connector 350 for the main board 400, as an uppermost structure thereof, and the connector 650 of the rigid-flexible PCB 600 may be connected to the connector 350 of the electronic component module 300. Thus, a power supply/signal connection between the display panel 500 and the main board 400 may be ensured through the electronic component module 300.

As described above, the connector 350 may be disposed by utilizing a mounting space of the electronic component module 300, and additional space consumption of the main board 400 due to the connector 350 may be prevented. In addition, since various passive components may be disposed in the component package 200 of the electronic component module 300, the space consumption of the main board 400 due to passive components may be reduced.

As a result, the size of the main board 400 employed in a mobile device may be reduced, and a sufficient space for other configurations such as a battery may be secured, or the mobile device may further be miniaturized.

An electronic component module according to the example embodiment may be implemented in various forms. The component package structure as well as the semiconductor package structure may be variously changed (for example, see FIGS. 14, 16 and 17), and passive components may be disposed, partially using a region of the semiconductor package without configuring a separate component package (see, for example, FIGS. 15 to 17).

Figure 14:
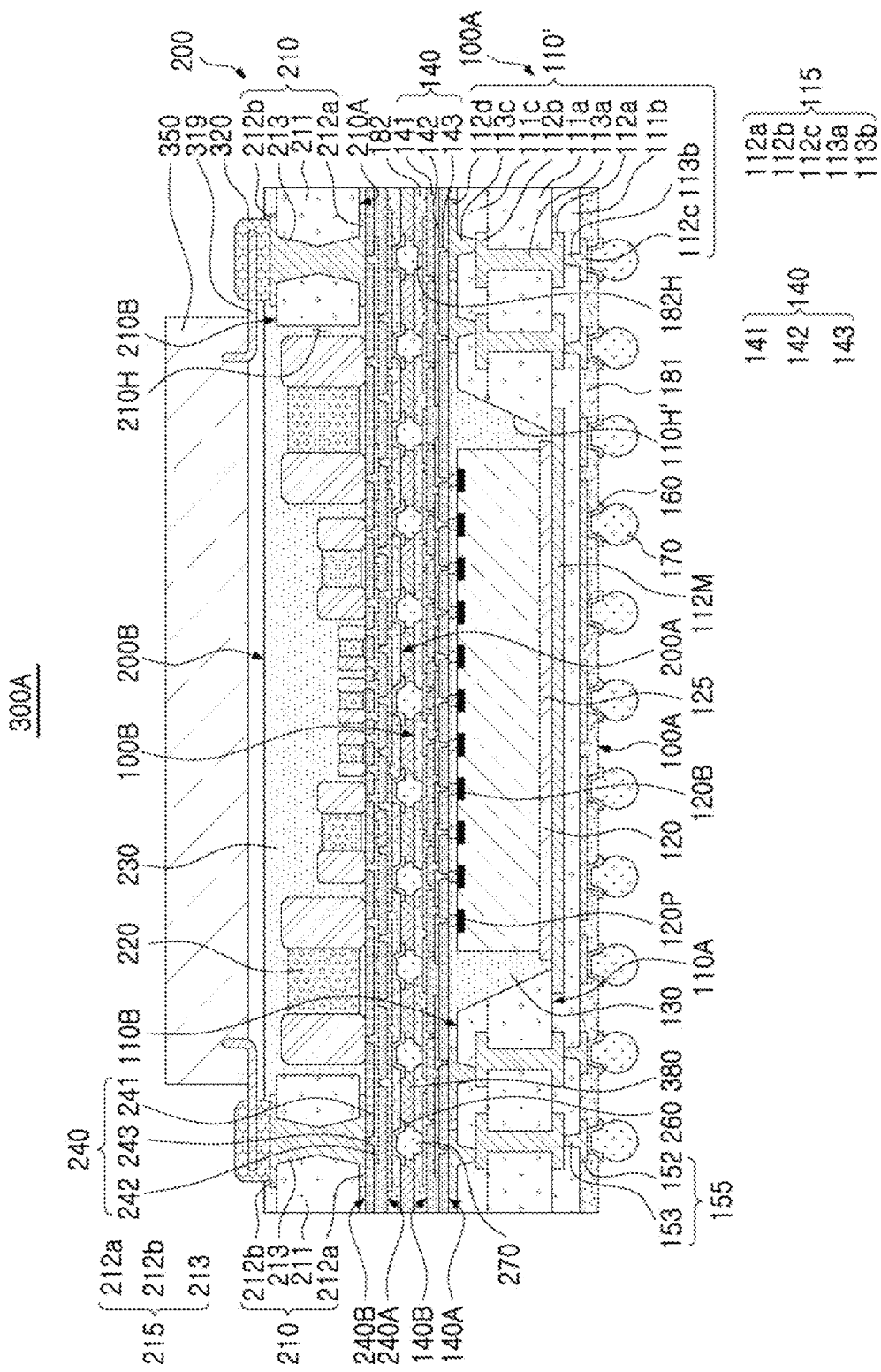
FIGS. 14 to 17 are schematic cross-sectional views of electronic component modules according to example embodiments of the present inventive concept.

FIG. 14 is a schematic cross-sectional view of an electronic component module according to an example embodiment.

Referring to FIG. 14, it can be understood that an electronic component module 300A according to the example embodiment has a structure similar to the structure illustrated in FIGS. 9 to 11 except that a semiconductor package 100A having a different structure is employed. The description of components of the example embodiment may be referred to the description of the same or similar components of the electronic component module 300 illustrated in FIGS. 9 to 11, unless otherwise specifically described.

The semiconductor package 100A employed in the example embodiment includes a first frame 110' disposed on a first surface 140A of a connection structure 140 and including a cavity 110H' having a recessed shape of which only a second surface 110B is open. A semiconductor chip 120 may be received in the cavity 110H' in such a manner that an inactive surface of the semiconductor chip 120 faces a bottom surface of the cavity 110H'. The bottom surface of the cavity 110H' may include a stop layer 112M formed of a material such as a metal and used as a stopper when the cavity 110H' is formed. The inactive surface of the first semiconductor chip 120 and the bottom surface of the cavity 110H may be attached to each other by an adhesive layer 125.

A conductive bump 120B may be disposed on a connection pad 120P of a semiconductor chip 120. The conductive bump 120B has a predetermined height and may have a substantially flat upper surface planar with a surface of the first encapsulant 130. A connection pad 120P of the semiconductor chip 120 may be connected to a first redistribution layer 142, in detail, a redistribution via 143, of a first connection structure 140 through the conductive bump 120B.

The first frame 110' employed in the example embodiment includes a core insulating layer 111a, a first wiring layer 112a and a second wiring layer 112b disposed on lower and upper surfaces of a core insulating layer 111a, respectively, a first buildup insulating layer 111b disposed below the core insulating layer 111a to cover the first wiring layer 112a, a third wiring layer 112c disposed on the first buildup insulating layer 111b, a second buildup insulating layer 111c disposed on an upper side of the core insulating layer 111a to cover the second wiring layer 112b, and a fourth wiring layer 112d disposed on the second buildup insulating layer 111c.

The first frame 110' includes a first wiring via 113a penetrating through the core insulating layer 111a and connecting the first wiring layer 112a and the second wiring layer 112b, a second wiring via 113b penetrating through the first buildup insulating layer 111b and connecting the first wiring layer 112a and the third wiring layer 112c, and a third wiring via 113c penetrating through the second buildup insulating layer 111c and connecting the second wiring layer 112b and the fourth wiring layer 112d.

Similar to the foregoing embodiment, a component package 200 is disposed on the semiconductor package 100A, and the first redistribution layer 142 of the first connection structure 140 and a second redistribution layer 242 of a second connection structure 240 may be electrically connected to each other. A connector 350 is disposed on the component package 200, and an external connection terminal 319 of the connector 350 may be electrically connected to a second wiring structure 215, in detail, a second wiring layer 212b.

The connector 350 employed in the example embodiment may be electrically connected to the first and third redistribution layers 142 and 152 of the semiconductor package 100 and a first wiring structure 115, as well as to the second wiring structure 215 and the second wiring layer 242, and thus, may also be electrically connected to a passive component 220 and the semiconductor chip 120.

Figure 15:
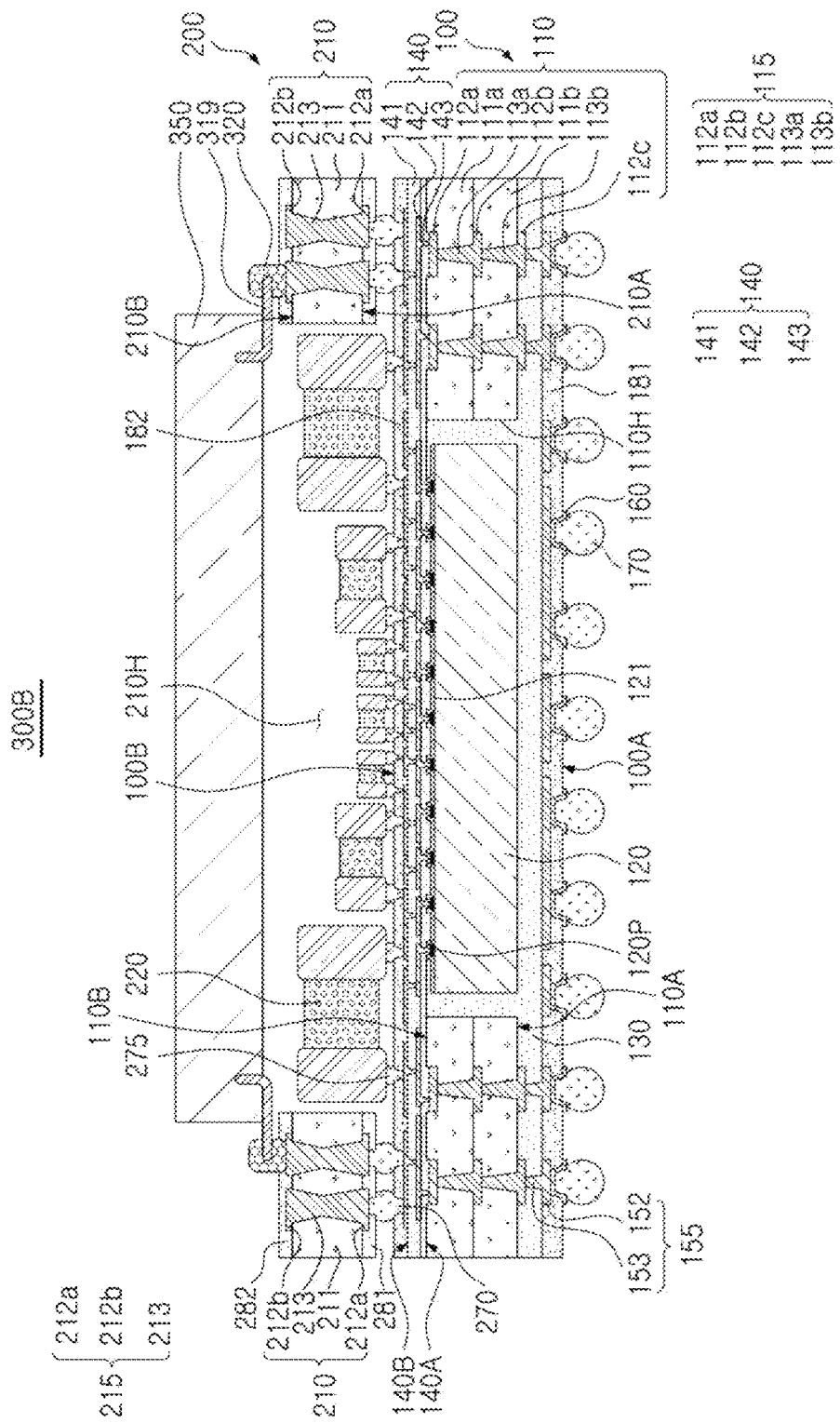

FIG. 15 is a schematic cross-sectional view of an electronic component module according to an example embodiment.

Referring to FIG. 15, an electronic component module 300B according to the example embodiment may be understood as similar to the structure illustrated in FIGS. 9 to 11, except that a separate component package is not formed. The description of components of the example embodiment may be referred to the description of the same or similar components of the electronic component module 300 illustrated in FIGS. 9 to 11, unless otherwise specifically described.

Although the electronic component module 300B according to the example embodiment includes a semiconductor package 100 similar to that of the example embodiment illustrated in FIG. 9, instead of a separate component package (see 200 in FIG. 9), a passive component 220 may be disposed directly on a second surface 100B of the semiconductor package 100, for example, on a second surface 140B of a first connection structure 140. The passive component 220 may be connected to a portion of a first redistribution layer 142 by a low melting point metal body 275. A connection region of the first redistribution layer 142 may be defined by an opening of a second passivation layer 182.

A second frame 210 is employed as an interposer interconnecting a connector 350 and the semiconductor package 100. The second frame 210 may include first and second wiring layers 212a and 212b disposed on both surfaces of an insulating member 211, respectively, and a wiring via 213 penetrating through the first and second wiring layers 212a and 212b, but an example embodiment thereof is not limited thereto, and thus, may also have another wiring structure in the form of providing a vertical connection path.

The second frame 210 may include first and second passivation layers 281 and 282 disposed on first and second surfaces 210A and 210B thereof, respectively. The first and second passivation layers 281 and 282 may each have openings that expose portions of the first and second wiring layers 212a and 212b. An external connection terminal 319 of a connector 350 is connected to a second wiring structure 215, in detail, the second wiring layer 212b, by a third electrical connection metal body 320 such as a low melting point metal, and the second wiring structure 215, in detail, the first wiring layer 212a, may be connected to the first redistribution layer 142 of the semiconductor package 100 by a second electrical connection metal body 270.

Figure 16:
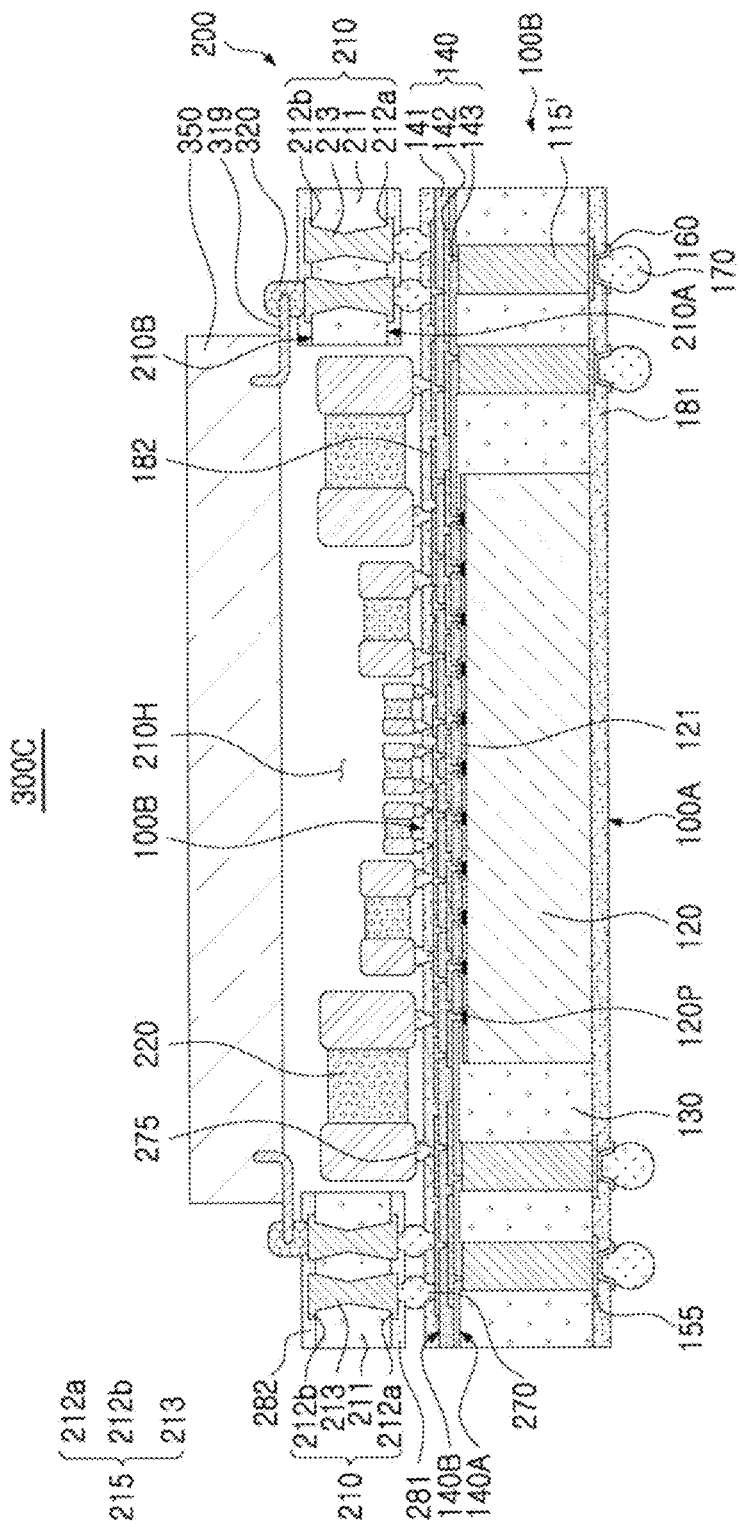

FIG. 16 is a cross-sectional view schematically illustrating an electronic component module according to an example embodiment.

Referring to FIG. 16, an electronic component module 300C according to an example embodiment may be understood as similar to the structure illustrated in FIGS. 9 to 11, except that a semiconductor package 100B having another structure is employed and a separate component package is not configured. The description of components of the example embodiment may be referred to the description of the same or similar components of the electronic component module 300 illustrated in FIGS. 9 to 11, unless otherwise specifically described.

A semiconductor package 100B according to the example embodiment may not have a frame structure but may have a metal post 115' penetrating through an encapsulant 130 as a wiring structure, a vertical connection structure. The metal post 115' may include, for example, copper (Cu). One end of the metal post 115' is connected to a first redistribution layer 142 of a first connection structure 140, and the other end of the metal post 115' is connected to a third redistribution layer 155. The third redistribution layer 155 may be disposed on a surface of a first encapsulant 130.

Although only the semiconductor package 100B is exemplified as having a wiring structure using the metal posts 115' without adopting a frame structure in this embodiment, similarly thereto, in the case of the wiring structure of the component package 200 of FIGS. 9 and 14, a second frame 210 may be replaced with a metal post penetrating through the second encapsulant 230.

The electronic component module 300C according to the example embodiment may be configured in such a manner that a passive component 220 is directly disposed on a second surface 100B of the semiconductor package 100, for example, on a second surface 140B of a first connection structure 140. In addition, the second frame 210 may have a second wiring structure 215 interconnecting a connector 350 and the semiconductor package 100B.

The second wiring structure 215 may include first and second wiring layers 212a and 212b and a wiring via 213 penetrating through the first and second wiring layers 212a and 212b. An external connection terminal 319 of the connector 350 may be connected to the second wiring structure 215, in detail, the second wiring layer 212b, by a third electrical connection metal body 320 such as a low melting point metal. The second wiring structure 215, in detail, the first wiring layer 212a, may be connected to the first redistribution layer 142 of the semiconductor package 100B by a second electrical connection metal body 270.

Figure 17:
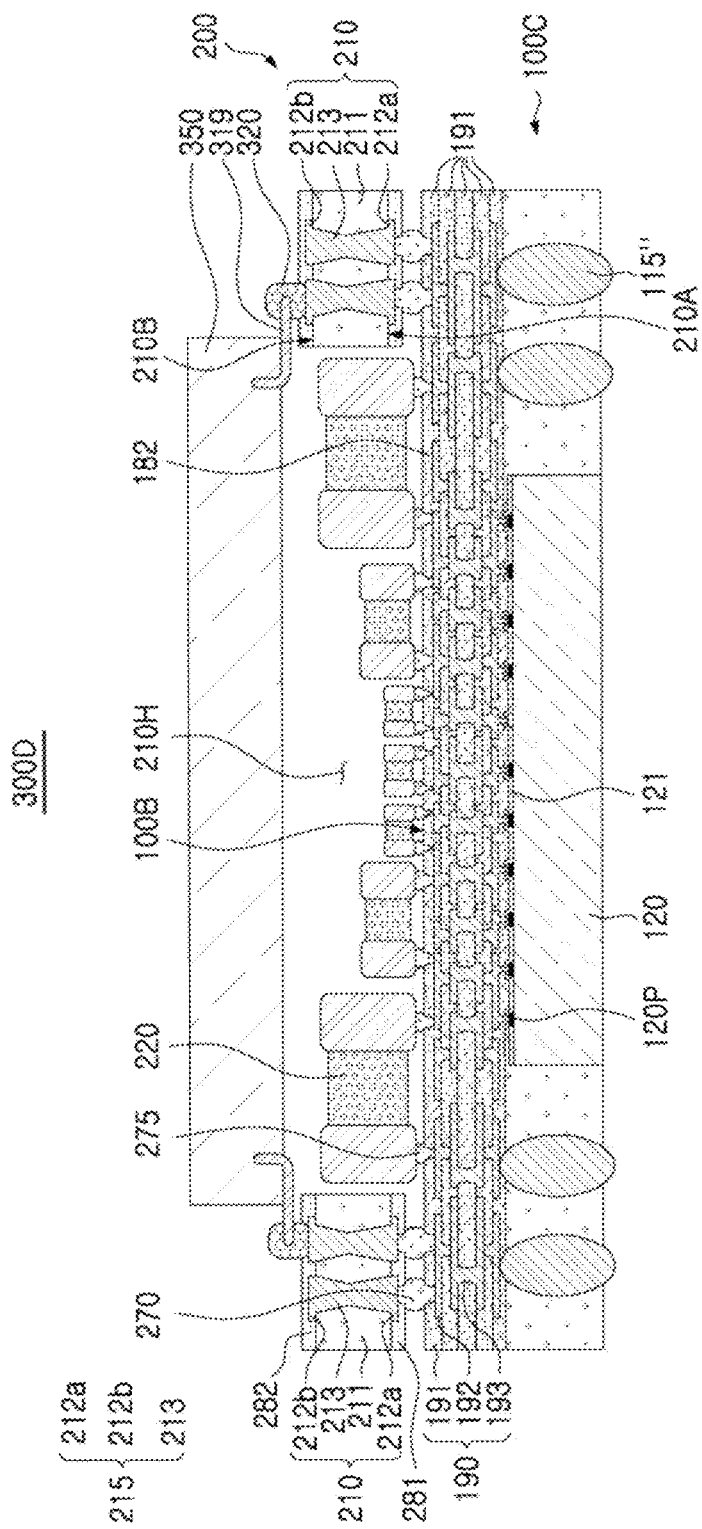

FIG. 17 is a cross-sectional view schematically illustrating an electronic component module according to an example embodiment.

Referring to FIG. 17, an electronic component module 300D according to an example embodiment may be understood as similar to the structure illustrated in FIGS. 9 and 10, except that a semiconductor package 100C having another structure is employed and a separate component package is not configured. The description of components of the example embodiment may be referred to the description of the same or similar components of the electronic component package 100 illustrated in FIGS. 9 and 10, unless otherwise specifically described.

A semiconductor package 100C according to the example embodiment may not have a frame structure but may have a low-melting point metal body 115" penetrating through an encapsulant 130 as a wiring structure which is a vertical connection structure, similarly to the semiconductor package 100B of the example embodiment with reference to FIG. 16. The low-melting metal body 115" may include, for example, a solder ball. The low-melting metal body 115" may be connected to the first redistribution layer 142 of the first connection structure 140 and extend to a mounting surface of the semiconductor package, to be exposed externally of the first encapsulant 130.

In the case of an electronic component module 300D according to the example embodiment, as similar to the electronic component modules 300B and 300C illustrated in FIGS. 15 and 16, a passive component 220 may be disposed directly on a second surface 100B of the semiconductor package 100, for example, on a second surface 140B of a first connection structure 140. In addition, the second frame 210 may have a second wiring structure 215 interconnecting the connector 350 and the semiconductor package 100B.

A first connection structure 190 employed in this embodiment may include a redistribution layer 192 to redistribute connection pads 120P of the semiconductor chip 120, and redistribution vias 193, similarly to the first connection structure 140 of the foregoing embodiments, and may also be implemented to have a thickness greater than the thickness of the first connection structure 140 of the foregoing embodiments as illustrated in FIG. 17. In detail, the first connection structure 190 may be understood as having a form manufactured by a general printed circuit board manufacturing process, similar to the case of the second frame 210.

The redistribution layer 192 of the first connection structure 190 may have a thickness similar to a thickness of a wiring layer of another frame as in the second frame 210, and may have a thickness greater than a thickness of a redistribution layer of a connecting structure manufactured by using a photoimageable dielectric material as an insulating layer. The insulating layer 191 constituting the first connection structure 190 may be formed of a thermosetting resin such as epoxy resin, a thermoplastic resin such as polyimide, or a mixture of these resins with an inorganic filler, or a resin in which these resins are impregnated with a core material such as a glass fiber, a glass cloth, a glass fabric, or the like, together with an inorganic filler, for example, a prepreg resin, Ajinomoto Bulid-up Film (ABF) resin, FR-4 resin, Bismaleimide Triazine (BT) resin, or the like.

As described above, the size of a main board may be significantly reduced by employing an uppermost structure of the electronic component module as a connector and mounting passive components in a single module. As a result, a sufficient space for other configurations such as a battery may be secured, or a mobile device may be further miniaturized.

As set forth above, according to an example embodiment, an electronic component module, in which a mounting space of a main board may be significantly reduced, by modularizing various components such as passive components together with a semiconductor chip into one, to be coupled to a connector, may be provided.

In the present inventive concept, the lower side, the lower portion, the lower surface and the like refer to the downward direction with respect to the cross section of the drawings for convenience, and the upper side, the upper portion, and the upper surface are used in the opposite direction thereto. It should be noted, however, that this is a definition of a direction for the sake of convenience of explanation, and the scope of rights of the claims is not particularly limited by description of such direction.

The meaning of being connected in the present inventive concept encompasses not only a direct connection, but also includes an indirect connection. In addition, the term "electrically connected" means a concept including both a physical connection and non-connection. Further, the expressions, 'first', 'second' and the like are used to distinguish one component from another component and do not limit the order and/or importance of components and the like. In some cases, without departing from the scope of the rights, a first component may be referred to as a second component, and similarly, a second component may also be referred to as a first component.

The expression, an example, used in this inventive concept does not mean the same embodiment, but is provided for emphasizing and explaining different unique features. However, the above-mentioned examples or embodiments do not exclude being implemented in combination with the features of other examples. For example, although the description in the specific example is not described in another example, it may be understood as an explanation related to another example, unless otherwise described or contradicted by the other example.

The terms used in this inventive concept are only used to illustrate an example and are not intended to limit the present inventive concept. The singular expressions include plural expressions unless the context clearly dictates otherwise.

While example embodiments have been shown and described above, it will be apparent to those skilled in the art that modifications and variations could be made without departing from the scope of the present disclosure as defined by the appended claims.

What is claimed is:

1. An electronic component module comprising:
a semiconductor package having a first surface provided as a mounting surface and a second surface opposing the first surface, and including a semiconductor chip;

a component package having a first surface facing the second surface of the semiconductor package, and a second surface opposing the first surface of the component package, the component package including a passive component; and a connector disposed on the second surface of the component package and having a connection surface configured to be mechanically coupled to an external device, the connector including a plurality of connection lines arranged on the connection surface.

2. The electronic component module of claim 1, wherein the semiconductor package further comprises:

a first connection structure having a first surface and a second surface opposing each other, the second surface of the first connection structure providing the second surface of the semiconductor package, the first connection structure having a first redistribution layer, a first encapsulant disposed on the first surface of the first connection structure and encapsulating the semiconductor chip; and a first wiring structure connected to the first redistribution layer and extending to the mounting surface of the semiconductor package, wherein the semiconductor chip is disposed on the second surface of the first connection structure, and includes a connection pad connected to the first redistribution layer.

3. The electronic component module of claim 2, wherein the semiconductor package further comprises:

a first frame having a first surface and a second surface opposing each other, the second surface of the first frame being in contact with the first surface of the first connection structure, the first frame having a cavity accommodating the semiconductor chip, and the first wiring structure penetrating through the first surface and the second surfaces of the first frame.

4. The electronic component module of claim 3, wherein the cavity has a through-hole penetrating through the first and second surfaces of the first frame.

5. The electronic component module of claim 3, wherein the cavity is a recess in which the second surface of the first frame is open.

6. The electronic component module of claim 3, wherein the semiconductor package further comprises:

an additional redistribution layer disposed on the first surface of the first frame and on the first encapsulant, and connected to the first wiring structure on the first surface of the first frame.

7. The electronic component module of claim 3, wherein the first wiring structure comprises a first metal post penetrating through the first encapsulant.

8. The electronic component module of claim 2, wherein the semiconductor package further comprises:

an electrical connection metal body disposed on the mounting surface and electrically connected to the first redistribution layer through the first wiring structure.

9. The electronic component module of claim 2, wherein the component package comprises:

a second connection structure having a first surface facing the second surface of the first connection structure, and a second surface, opposing the first surface of the second connection structure, the second connection structure including a second redistribution layer electrically connected to the first redistribution layer;

the passive component disposed on the second surface of the second connection structure, and connected to the second redistribution layer;

a second encapsulant disposed on the second surface of the second connection structure and encapsulating the passive component; and a second wiring structure connected to the second redistribution layer and extending to the second surface of the component package, and the connector is electrically connected to the second wiring structure.

10. The electronic component module of claim 9, wherein the component package further comprises:

a second frame having a first surface in contact with the second surface of the second connection structure, and a second surface opposing the first surface of the second frame, the second frame including a through-hole penetrating through the first and second surfaces of the second frame and accommodating the passive component, and the second wiring structure penetrates through the first and second surfaces of the second frame.

11. The electronic component module of claim 9, wherein the second wiring structure comprises a metal post penetrating through the second encapsulant.

* * * * *